United States Patent
Park et al.

(10) Patent No.: US 11,087,972 B2
(45) Date of Patent: Aug. 10, 2021

(54) CLEANING DEVICE AND METHOD FOR DRIVING CLEANING DEVICE

(71) Applicant: SAMSUNG ELECTRONICS CO., LTD., Suwon-si (KR)

(72) Inventors: Hyun Joon Park, Suwon-si (KR); Jin Yong Kim, Hwaseong-si (KR); Bong Ki Park, Osan-si (KR); Eun Sun Park, Yongin-si (KR); Jae Hyeon Seo, Suwon-si (KR); Young Chul Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 16/503,751

(22) Filed: Jul. 5, 2019

(65) Prior Publication Data

US 2020/0203152 A1 Jun. 25, 2020

(30) Foreign Application Priority Data

Dec. 24, 2018 (KR) .................. 10-2018-0168234

(51) Int. Cl.
  *H01L 21/02* (2006.01)
  *H01L 21/67* (2006.01)
  (Continued)

(52) U.S. Cl.
  CPC .. *H01L 21/02074* (2013.01); *H01L 21/67028* (2013.01); *H01L 21/67034* (2013.01);
  (Continued)

(58) Field of Classification Search
  CPC .............. B24B 41/005; B24B 27/0076; B24B 27/0023; B24B 27/0069; B24B 37/042;
  (Continued)

(56) References Cited

U.S. PATENT DOCUMENTS 8,308,529 B2  11/2012  D'Ambra et al.
8,795,032 B2  8/2014  Miyazaki et al.
(Continued)

FOREIGN PATENT DOCUMENTS

KR      10-0390293       9/2003
KR    10-2016-0078338    6/2018
KR      10-1905399      10/2018

*Primary Examiner* — Mikhail Kornakov
*Assistant Examiner* — Richard Z. Zhang
(74) *Attorney, Agent, or Firm* — F. Chau & Associates, LLC

(57) ABSTRACT

Provided are a cleaning device and a method for driving the cleaning device which cleans a wafer after chemical mechanical polishing. The cleaning device includes a cleaning modules and a running beam, the running beam including a first blade and a second blade to insert or remove the wafer with respect to one of the cleaning modules in a second direction, the first blade and the second blade being fixed to the running beam and movable in the second direction, and the cleaning modules including an input module, a megasonic module, a first brush module, a second brush module and a drying module. The driving method includes performing an operation of inserting or removing the wafer in the second direction using the first blade in a first area; and performing an operation of inserting or removing the wafer in the second direction using the second blade in a second area.

10 Claims, 10 Drawing Sheets

(51) Int. Cl.
*H01L 21/687* (2006.01)
*H01L 21/677* (2006.01)

(52) U.S. Cl.
CPC .. *H01L 21/67173* (2013.01); *H01L 21/67219* (2013.01); *H01L 21/67703* (2013.01); *H01L 21/67736* (2013.01); *H01L 21/68707* (2013.01); *H01L 21/67046* (2013.01); *H01L 21/67739* (2013.01); *H01L 21/67751* (2013.01); *H01L 21/67757* (2013.01)

(58) Field of Classification Search
CPC ............. B24B 37/345; H01L 21/68707; H01L 21/68728; H01L 21/67219; H01L 21/6719; H01L 21/67173; H01L 21/7684; H01L 21/304; H01L 21/30625; H01L 21/02074; H01L 21/67028; H01L 21/6704; H01L 21/67046; H01L 21/67034; H01L 21/677; H01L 21/67703; H01L 21/67736; H01L 21/67739; H01L 21/67742; H01L 21/67745; H01L 21/67748; H01L 21/67754; H01L 21/67751; H01L 21/67757; H01L 21/67766

See application file for complete search history.

(56) References Cited

U.S. PATENT DOCUMENTS

| | | |
|---|---|---|
| 9,144,881 B2 | 9/2015 | Nakao et al. |
| 2004/0129300 A1* | 7/2004 | Ohshimo .......... H01L 21/67173 134/61 |
| 2009/0025749 A1* | 1/2009 | Yudoovsky ....... H01L 21/67219 134/1 |
| 2013/0284215 A1 | 10/2013 | Liu et al. |
| 2017/0285609 A1* | 10/2017 | Isokawa ................ G05B 19/402 |
| 2018/0037852 A1 | 2/2018 | Thomas et al. |

* cited by examiner

CLEANING DEVICE AND METHOD FOR DRIVING CLEANING DEVICE

CROSS-REFERENCE TO RELATED APPLICATION

This application claims the benefit of Korean Patent Application No. 10-2018-0168234, filed on Dec. 24, 2018, in the Korean Intellectual Property Office, the disclosure of which is incorporated by reference herein in its entirety.

BACKGROUND

1. Field of the Disclosure

The present disclosure relates to a cleaning device which cleans a wafer after chemical mechanical polishing (CMP) and a method for driving the cleaning device.

2. Description of the Related Art

Equipment used in chemical mechanical polishing includes a polishing device which polishes a wafer, and a cleaning device which cleans the wafer after polishing. The cleaning device includes a plurality of cleaning modules disposed therein in a plurality of stages, and a wafer may be cleaned and dried while going through the aforementioned stages.

The cleaning device conveys the wafer between a plurality of cleaning modules, using a running beam, and the running beam may be equipped with a blade which inserts the wafer into the cleaning module or removes the wafer from the cleaning module. On the other hand, the wafer is cleaned and dried while going through a plurality of cleaning modules designed to remove relatively large size particles in an initial stage and to remove small size particles as the stage progresses.

However, when a single blade performs an operation of inserting or removing wafers into and out from a plurality of cleaning modules, there may be a problem in which contaminants generated in the cleaning module corresponding to the initial stage are transferred to a cleaning module corresponding to a later stage (or a drying module). This may result in a decrease in a manufacturing yield and an increase in a defect rate of the semiconductor devices.

SUMMARY

Aspects of the present disclosure provide a cleaning device including a plurality of cleaning modules for cleaning the wafer after chemical mechanical polishing (CMP), which prevents or minimizes contaminants generated in a cleaning module of the initial stage from being transferred to a cleaning module of a later stage, and a method for driving the cleaning device.

According to an aspect of the present disclosure, there is provided a method for driving a cleaning device which cleans a wafer after chemical mechanical polishing (CMP), the cleaning device including a plurality of cleaning modules and a running beam configured to convey the wafer in a first direction between the plurality of cleaning modules, the running beam including a first blade and a second blade configured to insert or remove the wafer with respect to one of the plurality of cleaning modules in a second direction perpendicular to the first direction, the first blade and the second blade being fixed to the running beam to be movable in the second direction, and the plurality of cleaning modules including an input module, a megasonic module, a first brush module, a second brush module and a drying module, the driving method including performing an operation of inserting or removing the wafer in the second direction using the first blade, in a first area including some cleaning modules of the plurality of cleaning modules; and performing an operation of inserting or removing the wafer in the second direction using the second blade, in a second area including some other cleaning modules of the plurality of cleaning modules.

According to another aspect of the present disclosure, there is provided a cleaning device which cleans a wafer after chemical mechanical polishing (CMP), the cleaning device including a plurality of cleaning modules; and a running beam which conveys the wafer in a first direction between the plurality of cleaning modules, the running beam includes a first blade and a second blade which are fixed to the running beam to be movable in a second direction perpendicular to the first direction, and insert or remove the wafer with respect to one of the plurality of cleaning modules in the second direction, the first blade performs an operation of inserting or removing the wafer in the second direction, in a first area including some cleaning modules of the plurality of cleaning modules, the second blade performs an operation of inserting or removing the wafer in the second direction, in a second area including some other cleaning modules of the plurality of cleaning modules, and the plurality of cleaning modules includes an input module, a megasonic module, a first brush module, a second brush module and a drying module.

According to still another aspect of the present disclosure, there is provided a computer-readable recording medium in which a driving program of a cleaning device for cleaning a wafer after chemical mechanical polishing (CMP) is stored, wherein the cleaning device includes a plurality of cleaning modules and a running beam configured to convey the wafer in a first direction between the plurality of cleaning modules, the running beam includes a first blade and a second blade configured to insert or remove the wafer with respect to one of the plurality of cleaning modules in a second direction perpendicular to the first direction, the first blade and the second blade are fixed to the running beam to be movable in the second direction, and the plurality of cleaning modules includes an input module, a megasonic module, a first brush module, a second brush module and a drying module, the driving program including instructions for performing an operation of inserting or removing the wafer in the second direction using the first blade, in a first area including some cleaning modules of the plurality of cleaning modules; and performing an operation of inserting or removing the wafer in the second direction using the second blade in a second area including some other cleaning modules of the plurality of cleaning modules.

According to still another aspect of the present disclosure, there is provided a method of preventing contamination of a wafer cleaning device comprising a plurality of cleaning modules, the method comprising identifying a first area and a second area of the cleaning device, wherein each of the first area and the second area each includes one or more of the cleaning modules and a common cleaning module is included in both the first area and the second area; inserting a wafer into the common cleaning module using a first blade attached to a running beam based at least in part on the common cleaning module being located in the first area; and removing the wafer from the common cleaning module using a second blade attached to the running beam based at least in part on the common cleaning module being located in the second area.

Some examples of the method further include inserting the wafer into a cleaning module in the first area using the first blade; and removing the wafer from the cleaning module with the first blade based on the cleaning module not being located within the second area. Some examples of the method include determining whether chemicals used in two cleaning modules are the same, wherein the first area and the second area are identified based on the determination.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Hereinafter, various embodiments of the present disclosure will be described with reference to the accompanying drawings.

Figure 1:
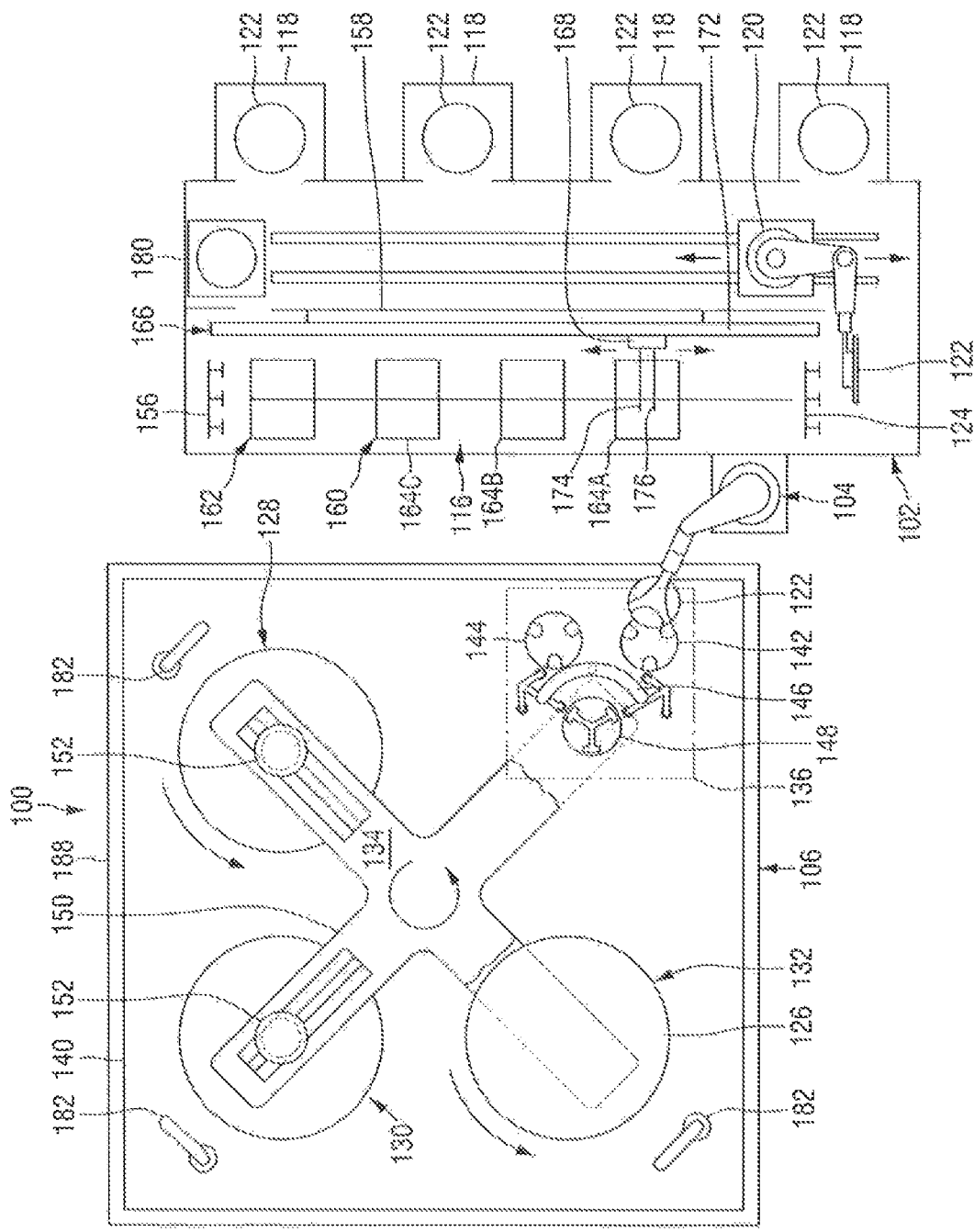
FIG. 1 is a diagram illustrating a chemical mechanical polishing system according to an embodiment of the present disclosure.

FIG. 1 is a diagram illustrating a chemical mechanical polishing system according to an embodiment of the present disclosure.

Referring to FIG. 1, a chemical mechanical polishing system 100 according to an embodiment of the present disclosure includes a factory interface 102, a loading unit 104 and a planarization unit 106. The loading unit 104 is located between the factory interface 102 and the planarization unit 106 to perform the transfer of the wafer 122 between them.

The factory interface 102 includes a cleaning device 116 and one or more cassettes 118. The interface unit 120 performs the transfer of the wafer 122 between the cassette 118 and the cleaning device 116 (especially, an input module 124).

The planarization unit 106 includes one or more chemical mechanical polishing stations 128, 130 and 132 inside an enclosure 188. As an example, the planarization unit 106 may be implemented to operate in a REFLEXION LK chemical mechanical polishing system manufactured by AMAT, but the scope of the present disclosure is not limited thereto.

The planarization unit 106 includes a first chemical mechanical polishing station 128, a second chemical mechanical polishing station 130, and a third chemical mechanical polishing station 132. The first chemical mechanical polishing station 128 performs a bulk removal of a conductive material from the wafer 122 via a chemical mechanical planarization process. The second chemical mechanical polishing station 130 performs a removal of the residual conductive material from the wafer 122 subjected to a bulk removal in the first chemical mechanical polishing station 128, through an additional chemical mechanical planarization process. Also, the third chemical mechanical polishing station 132 performs an additional planarization process on the wafer 122 subjected to the removal of the residual conductive material from the second chemical mechanical polishing station 130, through an additional chemical mechanical planarization process. Since further detailed contents of such a polishing process are already known, the description thereof will not be provided in this specification.

The planarization unit 106 further includes a rotating unit 134 and a transfer station 136 disposed on a machine base 140. In this embodiment, the transfer station 136 includes an input buffer station 144, an output buffer station 142, a transfer unit 146 and a load cup assembly 148. A wafer 122 is provided to the input buffer station 144 from the factory interface 102 through a loading unit 104. The loading unit 104 also conveys the polished wafer 122 from the output buffer station 142 to the factory interface 102. The transfer unit 146 moves the wafer 122 between the input buffer station 144, the output buffer station 142 and the load cup assembly 148.

In this embodiment, the transfer unit 146 may include, for example, two gripper assemblies. Each gripper assembly may include a pneumatic gripper finger that holds the wafer 122. While the previously processed wafer 122 is transferred from the load cup assembly 148 to the output buffer station 142, the transfer unit 146 may also transfer a wafer 122 to be processed later from the input buffer station 144 to the load cup assembly 148.

The rotating unit 134 is arranged at the center of the machine base 140. The rotating unit 134 includes a plurality of arms 150, and each arm 150 supports a planarizing head assembly 152. In FIG. 1, two of the plurality of arms 150 are truncated to illustrate the planarizing surface 126 and the transfer station 136 of the third chemical mechanical polishing station 132. The rotating unit 134 is implemented to be indexable so that the planarizing head assembly 152 may move between the chemical mechanical polishing stations 128, 130 and 132 and the transfer station 136.

An adjustment device 182 is disposed on the machine base 140 in close proximity to each of the chemical mechanical polishing stations 128, 130 and 132. The adjustment device 182 periodically adjusts the planarizing material to be provided to the chemical mechanical polishing stations 128, 130 and 132 so that the flattening result is uniformly maintained.

In the present embodiment, the factory interface 102 may further include a metrology device 180 for testing the cleaning device 116. The metrology device 180 may include an optical metrology device.

The cleaning device 116 removes polishing debris that may remain after polishing, polishing fluid that flows from the polished wafer 122, and the like. The wafer 122 moves, while passing through the plurality of cleaning modules 160 by a wafer handling module 166 arranged around the plurality of cleaning modules 160 while the cleaning process is performed. The cleaning device 116 includes a plurality of cleaning modules 160, and in this embodiment, the plurality of cleaning modules 160 includes an input module 124, a megasonic module 164A, a first brush module 164B, a second brush module 164C and a drying module 162.

The input module 124 acts like a transfer station between the factory interface 102, the cleaning device 116 and the planarization unit 106. The drying module 162 conveys the dried wafer 122 to the output module 156 after drying the cleaned wafer 122. In this embodiment, the drying module 162 may dry the wafer 122 using deionized water and Isopropyl alcohol.

The megasonic module 164A, the first brush module 164B and the second brush module 164C may be implemented to process the vertical wafer 122 in which the polished surface becomes a substantially vertical plane. Immediately after the polishing is completed, the megasonic module 164A receives the wafer 122 cleaned with deionized water as necessary, and removes large size particles, using a cavitation of megasonic of about 700 W. Therefore, the contamination degree inside the megasonic module 164A is high. The first brush module 164B performs primary scrubbing of the wafer 122 using, for example, a PVA sponge (Polyvinyl Alcohol sponge) to primarily remove contamination, and the second brush module 164C performs secondary scrubbing of the wafer 122 using, for example, the PVA sponge to secondarily remove contamination. The wafer 122 in which the contamination is removed by the second brush module 164C is conveyed to the aforementioned drying module 162 and dried.

The chemical mechanical polishing system 100 conveys the wafer 122 from one of a plurality of cassettes 118 to the input module 124 by the interface unit 120. Then, the loading unit 104 removes the wafer 122 from the input module 124 and conveys it to the planarization unit 106, and the wafer 122 is polished in the horizontal direction. After polishing is performed, the loading unit 104 extracts the wafer 122 from the planarization unit 106 and places the wafer 122 on the input module in the vertical direction. The wafer handling module 166 extracts the wafer 122 from the input module 124 to cause the wafer 122 to pass through at least one of the megasonic module 164A, the first brush module 164B and the second brush module 164C of the cleaning device 116. Each of the megasonic module 164A, the first brush module 164B and the second brush module 164C is implemented to process the wafer 122 in the vertical direction. After cleaning, when the wafer handling module 166 conveys the wafer 122 to the drying module 162 and then conveys the dried wafer 122 to the output module 156, the wafer 122 is flipped in the horizontal direction and conveyed to one of the cassettes 118 via the interface unit 120, Optionally, the interface unit 120 or the wafer handling module 166 may also convey the wafer 122 to the metrology module 180 before conveying to the cassette 118.

The wafer handling module 166 includes a running beam 168. The running beam 168 includes two blades 174 and 176, and the two blades 174 and 176 operate to be able to convey the wafer 122 among the input module 124, the megasonic module 164A, the first brush module 164B, the second brush module 164C and the drying module 162. The wafer handling module 166 includes a rail 172 coupled to a partition 158 for separating the cassette 118 and the interface unit 120 from the cleaning device 116. The running beam 168 operates while moving along the rail 172 so that the wafer 122 may approach the input module 124, the megasonic module 164A, the first brush module 164B, the second brush module 164C and the drying module 162.

According to aspects of the present disclosure, the cleaning device 116 may identify a first area and a second area, where each region includes one or more of the cleaning modules 160, and at least one common cleaning module is included in both regions. The cleaning device 116 may insert the wafer 122 into a cleaning module 160 of the first area using the first blade 176; and also remove the wafer 122 from the cleaning module 160 with the first blade based on the cleaning module not being located within the second area.

Then the cleaning device 116 may insert the wafer into the common cleaning module using the first blade 176 based at least in part on the common cleaning module being located in the first area, and remove the wafer 122 from the common cleaning module using a second blade 174 based at least in part on the common cleaning module being located in the second area. The cleaning device may use the second blade 174 for inserting and removing the wafer 122 from subsequent cleaning modules 160 in the second area.

Thus, by initially using the first blade 176 and then switching to using the second blade 174 to insert and remove the wafer 122 from the cleaning modules 160, the cleaning device 116 may reduce contamination between the cleaning modules 160. This may help improve the yield of a wafer fabrication process. In some examples, the cleaning device 116 may also control the operation of the first blade 176 and the second blade 174 such that the blades do not insert or remove wafers at the same time to further reduce contamination between cleaning modules 160.

In some cases, the cleaning device 116 may determine whether chemicals used in two cleaning modules are the same, wherein the first area and the second area are identified based on the determination. In some examples, the chemicals used, or other aspects of the cleaning process (including which blade is used for inserting and removing the wafer) may depend on the type of the wafer 122 (i.e., the kind of materials on the wafer).

Figure 2:
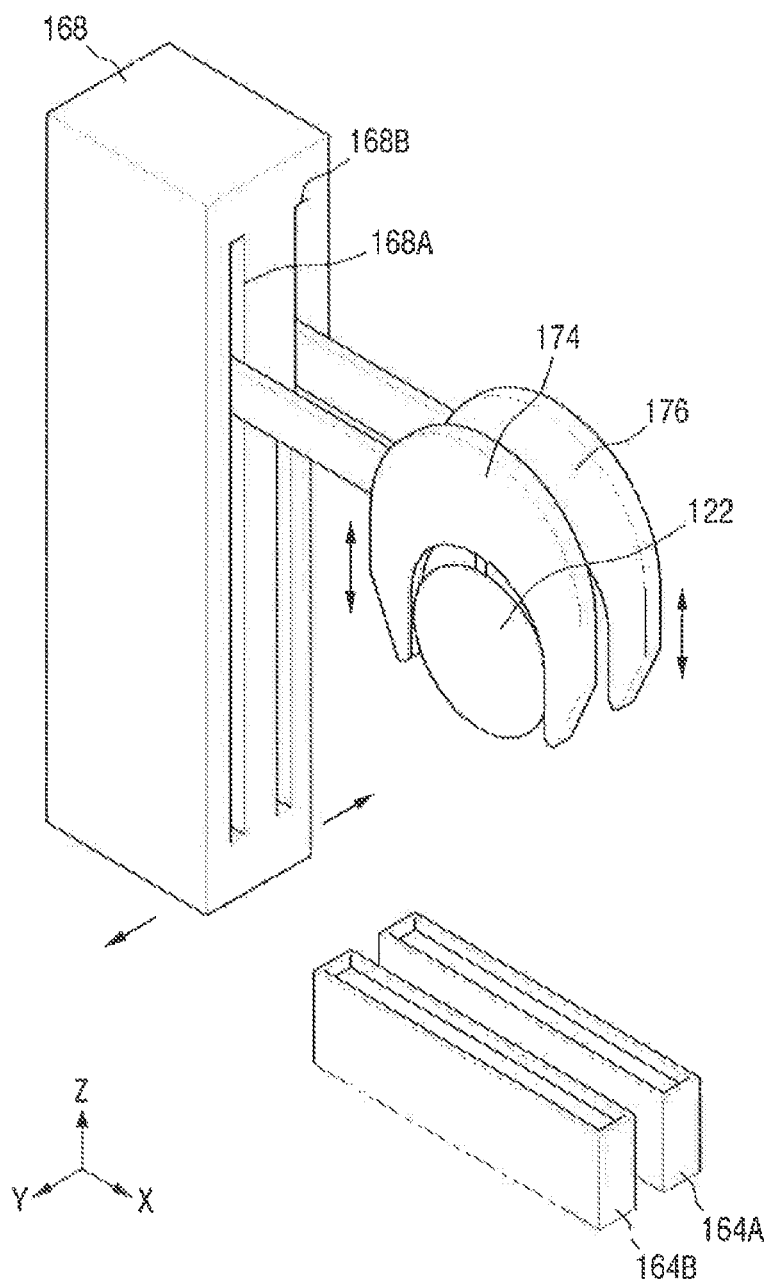
FIG. 2 is a diagram illustrating a part of the cleaning device of FIG. 1 according to an embodiment of the present disclosure.

FIG. 2 is a diagram illustrating a part of the cleaning device 116 of FIG. 1.

Referring to FIG. 2, the cleaning device 116 includes a plurality of cleaning modules 160 including a megasonic module 164A and a first brush module 164B, and a running beam 168 which conveys the wafer 122 between the plurality of cleaning modules 160.

The running beam 168 may convey the wafer 122 between the plurality of cleaning modules 160, while moving in a first direction (Y-axis direction), for example, in a left-right direction.

The running beam 168 includes a first blade 176 and a second blade 174. The first blade 176 and the second blade 174 are fixed to the running beam 168 so as to be movable in a second direction (Z-axis direction) perpendicular to the first direction (Y-axis direction). Therefore, the first blade 176 and the second blade 174 may insert or remove the wafer 122 into and from one of the plurality of cleaning modules 160 in the second direction (Z-axis direction). For example, the first blade 176 and the second blade 174 may perform a pick-up operation and a drop-off operation of the wafer 122.

For example, the first blade 176 or the second blade 174 may perform the drop-off operation to insert the held wafer 122, for example, into the megasonic module 164A. Here, the drop-off operation means an operation in which the first blade 176 or the second blade 174 moves in a downward direction of the second direction (Z-axis direction) along the guides 168A and 168B provided on one side surface of the running beam 168, then places, for example, the held wafer 122 inside the megasonic module 164A, and the first blade 176 or the second blade 174 moves again along the guides 168A and 168B in a upward direction of the second direction (Z-axis direction).

On the other hand, the first blade 176 or the second blade 174 may perform a pick-up operation to remove the wafer 122 that is inserted into the megasonic module 164A and completely cleaned. Here, the pick-up operation means an operation in which the first blade 176 or the second blade 174 moves in the downward direction of the second direction (Z-axis direction) along the guides 168A and 168B provided on one side surface of the running beam 168, then holds, for example, the wafer 122 inserted in the megasonic module 164A, and then, the first blade 176 or the second blade 174 moves again in the upward direction of the second direction (Z-axis direction) along the guides 168A and 168B.

Figure 3:
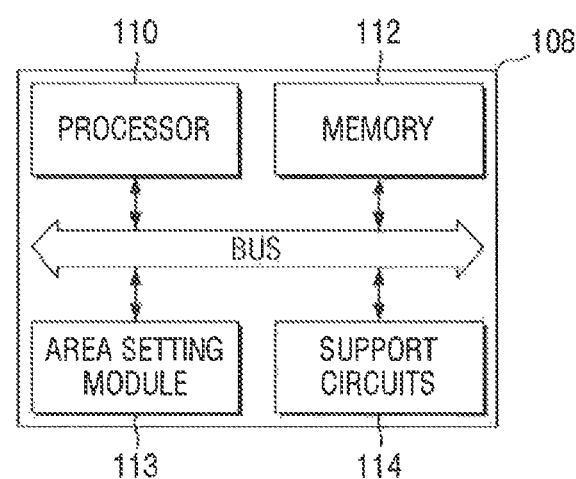
FIG. 3 is a diagram illustrating a controller for driving the chemical mechanical polishing system of FIG. 1 according to an embodiment of the present disclosure.

Such a cleaning device 116 may be driven by the controller 108 described in FIG. 3. For example, the detailed operation of the running beam 168, the first blade 176 and the second blade 174 may be driven by software executed by the controller 108 or an electronic circuit provided in the controller 108.

By controlling which of the first blade 176 and the second blade 174 is used to insert or remove the wafer 122 from cleaning modules 160, the cleaning device 116 may reduce contamination between the cleaning modules. For example, contaminants from one cleaning module 160 may be prevented from being transferred to subsequent cleaning modules 160 because a different blade is used for inserting or removing the wafer 122.

FIG. 3 is a diagram illustrating a controller for driving the chemical mechanical polishing system of FIG. 1.

Referring to FIG. 3, a controller 108 which drives the chemical mechanical polishing system 100 of FIG. 1 may include a processor 110, a memory 112, an area setting module 113, and other support circuits 114. The processor 110, the memory 112, the area setting module 113, and other support circuits 114 may mutually transmit and receive data via a bus.

The processor 110 may execute a driving program with non-transitory computer readable instructions for controlling the overall chemical mechanical polishing system 100. In the present embodiment, the processor 110 may include a CPU (Central Processing Unit), but the scope of the present disclosure is not limited thereto. Here, although the driving program is generally implemented by software such as a program executable by the processor 110, the driving program may also be implemented as hardware such as a programmable semiconductor circuit to provide a function of the driving program. Further, the driving program may be stored in a computer-readable recording medium.

The memory 112 provides space necessary for executing the driving program. For example, the memory 112 provides an environment in which the driving program itself is loaded to make it executable by the processor 110. Additionally or alternatively, the memory 112 provides storage for data used during execution of the driving program. In the present embodiment, the memory 112 may include a DRAM (Dynamic Random Access Memory), but the scope of the present disclosure is not limited thereto.

The area setting module 113 provides the functions of setting an area managed by the first blade 176 and setting an area managed by the second blade 174 among the plurality of cleaning modules 160, in the operation of the cleaning device 116 described later with reference to FIGS. 4 to 10. Here, the area setting module 113 may be implemented by hardware such as an electronic circuit including the semiconductor elements, by software such as program executable by the processor 110 as a part of the driving program or separately from the driving program, or by a combination of hardware and software.

The area setting module 113 may set the area managed by the different blades based on what chemicals are used in different cleaning modules 160 and/or the difference in contaminations levels within the different cleaning modules 160. For example if the first brush module 164B and the second brush module 164C use the same cleaning chemical, it may be an indication that the difference in contamination levels between then is relatively small, thus, the blade used for inserting and removing the wafer 122 may be changed at the first brush module 164B (i.e., the area setting module 113 may set the first brush module 164B as the area of overlap between the different areas managed by the different blades). As another example, if the chemicals used by first brush module 164B and the second brush module 164C are different, it may be an indication that the contamination levels between are higher. Thus, the blade used for inserting and removing the wafer 122 may be changed at the second brush module 164C (i.e., the area setting module 113 may set the second brush module 164C as the area of overlap between the different areas managed by the different blades).

The other support circuits 114 may additionally include devices added as appropriate depending on the implementation purpose or use purpose of the chemical mechanical polishing system 100. For example, the other support circuits 114 may further include a communication interface for data transmission between the chemical mechanical polishing system 100 and the outside, an input/output interface for connecting an input/output device, a display interface for connecting a display device, a storage device for storing data, and the like.

Figure 4:
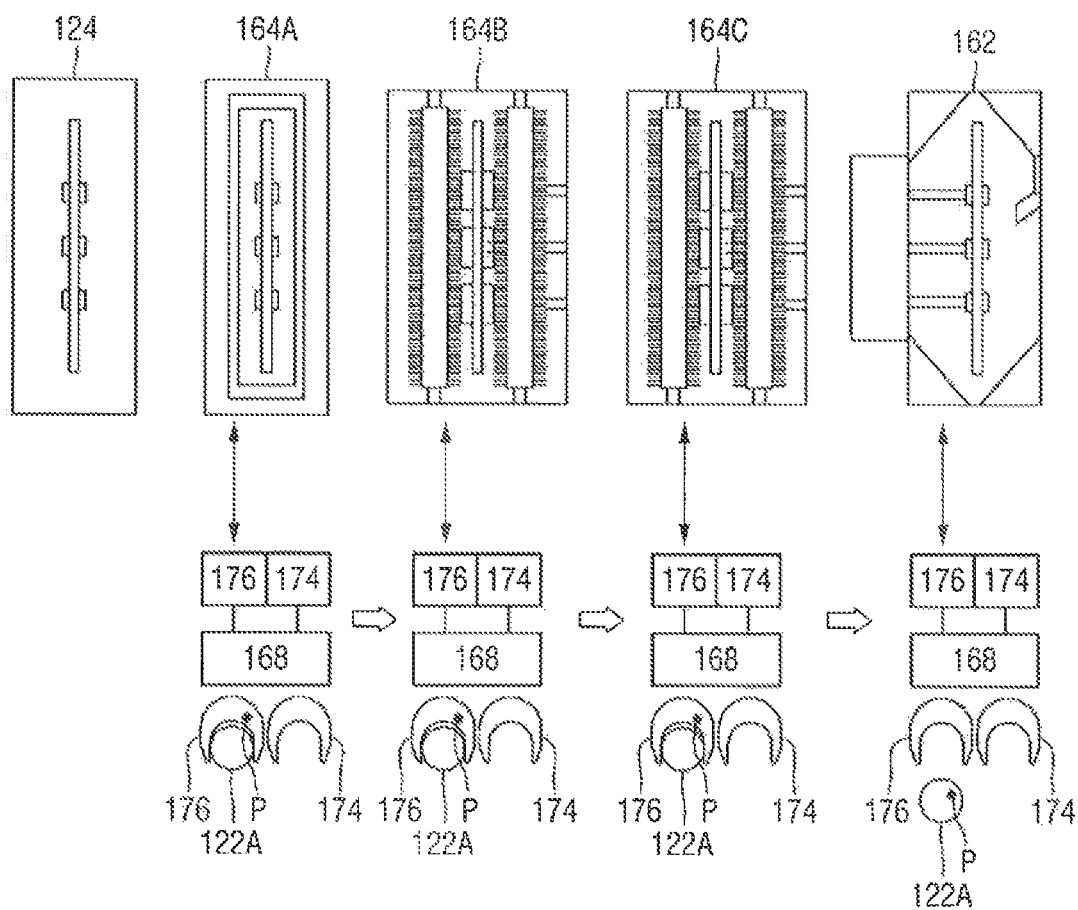
FIG. 4 is a diagram illustrating contamination that may be generated with the operation of the cleaning device of FIG. 1 according to an embodiment of the present disclosure.

FIG. 4 is a diagram illustrating contamination that may be generated with the operation of the cleaning device 116 of FIG. 1. The contamination described by FIG. 4 may be an undesired result that is reduced using the systems and methods described in the present disclosure.

Referring to FIG. 4, when the first blade 176 or the second blade 174 of the cleaning device 116 of FIG. 1 manages the plurality of cleaning modules 160, for example, contaminants generated from the megasonic module 164A may be transferred not only to the first brush module 164B but also to the second brush module 164C and further to the drying module 162.

For example, for the sake of convenience of explanation, the first blade 176 will be mainly described. First, a first blade 176 which picked up the polished wafer 122A via the input module 124 may drop off the wafer 122A to the megasonic module 164A for cleaning of the wafer 122A.

Generally, it may be understood that the contamination degree of a plurality of cleaning modules 160 decreases as the cleaning stage proceeds. However, since the megasonic module 164A corresponds to the first stage of cleaning, the contamination degree among the plurality of cleaning modules 160 is the worst. For example, inside the megasonic module 164A, there are a large number of particles from relatively large size particles to small size particles which have adhered to the polished wafer 122A and then separated by megasonic module 164A, and the contamination degree is relatively high.

Thereafter, the first blade 176 picks up the wafer 122A from the megasonic module 164A for cleaning at the next stage, and drops off the wafer 122A to the first brush module 164B. However, when the first blade 176 picks up the wafer 122A inserted in the megasonic module 164A, contaminant particles P generated at the stage of the megasonic module 164A may adhere to the first blade 176 or the wafer 122A. When the first blade 176 drops off the wafer 122A to the first brush module 164B, the contamination particles P adhered to the first blade 176 or the wafer 122A enter the first brush module 164B, and the contamination degree of the first brush module 164B may increase accordingly.

Likewise, the first blade 176 picks up the wafer 122A from the first brush module 164B for cleaning at the next stage, and drops off the wafer 122A to the second brush module 164C. However, when the first blade 176 picks up the wafer 122A inserted in the megasonic module 164A, some of the contaminant particles P generated at the stage of the megasonic module 164A may still adhere to the first blade 176 or the wafer 122A. When the first blade 176 drops off the wafer 122A to the second brush module 164C, contamination particles P adhering to the first blade 176 or the wafer 122A may enter the second brush module 164C, and the contamination degree of the second brush module 164C may also increase accordingly.

Likewise, the first blade 176 picks up the wafer 122A from the second brush module 164C for cleaning at the next stage, for example, drying, and drops off the wafer 122A to the drying module 162. However, when the first blade 176 picks up the wafer 122A inserted in the megasonic module 164A, some of the contaminant particles P generated at the stage of the megasonic module 164A may still adhere to the first blade 176 or the wafer 122A. When the first blade 176 drops off the wafer 122A to the drying module 162, the contamination particles P adhering to the first blade 176 or the wafer 122A may enter the drying module 162, and the contamination degree of the second brush module 164C may also increase accordingly.

For example, there may be a problem that contaminants generated in the megasonic module 164A are transferred not only to the first brush module 164B but also to the first brush module 164C and further to the drying module 162. Embodiments of the present disclosure for solving such a problem will now be described with reference to FIGS. 5 to 7.

Figure 5:
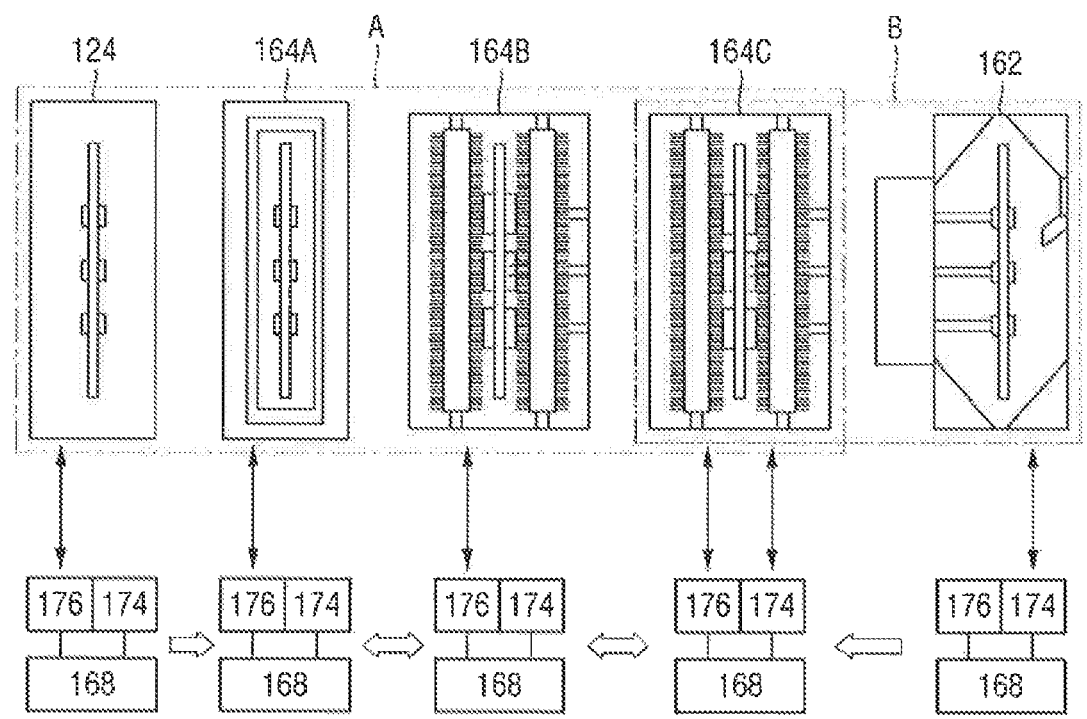
FIG. 5 is a diagram illustrating a method for driving the cleaning device according to an embodiment of the present disclosure.

FIG. 5 is a diagram illustrating a method for driving the cleaning device 116 according to an embodiment of the present disclosure. For example, FIG. 5 describes a method of switching which blade is used for inserting and removing a wafer so that contaminants are not transferred from one cleaning module 160 to another as described above with reference to FIG. 4.

Referring to FIG. 5, in relation to the method for driving the cleaning device 116 according to an embodiment of the present disclosure, the area setting module 113 of FIG. 3 sets some cleaning modules of the plurality of cleaning modules 160 as a first area A, and sets some other cleaning modules of the plurality of cleaning modules 160 as a second area B. It should be noted that at least one module of the plurality of cleaning modules 160 may belong to both the first area A and the second area B.

The double sided arrows of FIG. 5 show whether the first blade 176 or the second blade 174 (or both) is used to insert and remove a wafer from each of the cleaning modules 160. Thus, initially, the first blade 176 may be used for both insertion and removal in the first area A. In the overlapping area the first blade 176 may be used for insertion and the second blade 174 may be used for removal. In the second area, the second blade 174 may be used for both insertion and removal.

The first blade 176 performs the operation of inserting or removing the wafer 122 in a second direction (Z-axis direction) in the first area. A including some cleaning modules of the plurality of cleaning modules 160. For example, the first blade 176 may refrain from performing the operation of inserting or removing the wafer 122 in the second direction (Z-axis direction) with respect to cleaning modules not included in the first area A but included only in the second area B, among the plurality of cleaning modules 160.

In some embodiments of the present disclosure, the first blade 176 may perform only the operation of inserting the wafer 122 in the second direction (Z-axis direction), with respect to cleaning modules commonly included in the first area A and the second area B, among the plurality of cleaning modules 160.

On the other hand, the second blade 174 performs the operation of inserting or removing the wafer 122 in the second direction (Z-axis direction) in the second area B including some other cleaning modules of the plurality of cleaning modules 160. For example, the second blade 174 may refrain from performing the operation of inserting or removing the wafer 122 in the second direction (Z-axis direction) with respect to the cleaning modules not included in the second area B but included only in the first area A, among the plurality of cleaning modules 160.

In some embodiments of the present disclosure, the second blade 174 may perform only the operation of removing the wafer 122 in the second direction (Z-axis direction), with respect to cleaning modules commonly included in the first area A. and the second area B, among the plurality of cleaning modules 160.

In the present embodiment, the area setting module 113 sets the first area A to include the input module 124, the megasonic module 164A, the first brush module 164B and the second brush module, and sets the second area B to include the second brush module 164C and the drying module 162.

Therefore, the first blade 176 may perform the operations of inserting and removing the wafer 122 in the second direction (Z-axis direction) in the first area A including the input module 124, the megasonic module 164A, the first brush module 164B and the second brush module 164C, and may refrain from performing the operations of inserting or removing the wafer 122 in the second direction (Z-axis direction) with respect to the drying module 162 not included in the first area A but included only in the second area B.

In some embodiments of the present disclosure, the first blade 176 may perform only the operation of inserting the wafer 122 in the second direction (Z-axis direction) with respect to the second brush module 164C commonly included in the first area A and the second area B.

Meanwhile, the second blade 174 may perform the operations of inserting and removing the wafer 122 in the second direction (Z-axis direction) in the second area B including the second brush module 164C and the drying module 162, and may refrain from performing the operations of inserting or removing the wafer 122 in the second direction (Z-axis direction) with respect to the input module 124, the megasonic module 164A, and the first brush module 164B not included in the second area B but included only in the first area A.

In some embodiments of the present disclosure, the second blade 174 may perform only the operation of removing the wafer 122 in the second direction (Z-axis direction) with respect to second brush module 164C commonly included in the first area A and the second area B, among the plurality of cleaning modules 160.

In this way, by dividing the areas of the plurality of cleaning modules 160 and distinguishing the operating areas of the first blade 176 and the second blade 174, it is possible to prevent or minimize transfer of contaminants from one module to another module, such as transfer of the contaminants generated in the megasonic module 164A not only to the first brush module 164B but also to the first brush module 164C and further to the drying module 162.

On the other hand, the method of setting the first area A and the second area B by the area setting module 113 may vary in different embodiments. For example, unlike the case of FIG. 5, the area setting module 113 may set the first area A to include the input module 124, the megasonic module 164A and the first brush module 164B, and may set the second area B to include the first brush module 164B, the second brush module 164C and the drying module 162. Of course, the area setting module 113 may also set the first area. A and the second area 13 depending various driving policies.

Figure 6:
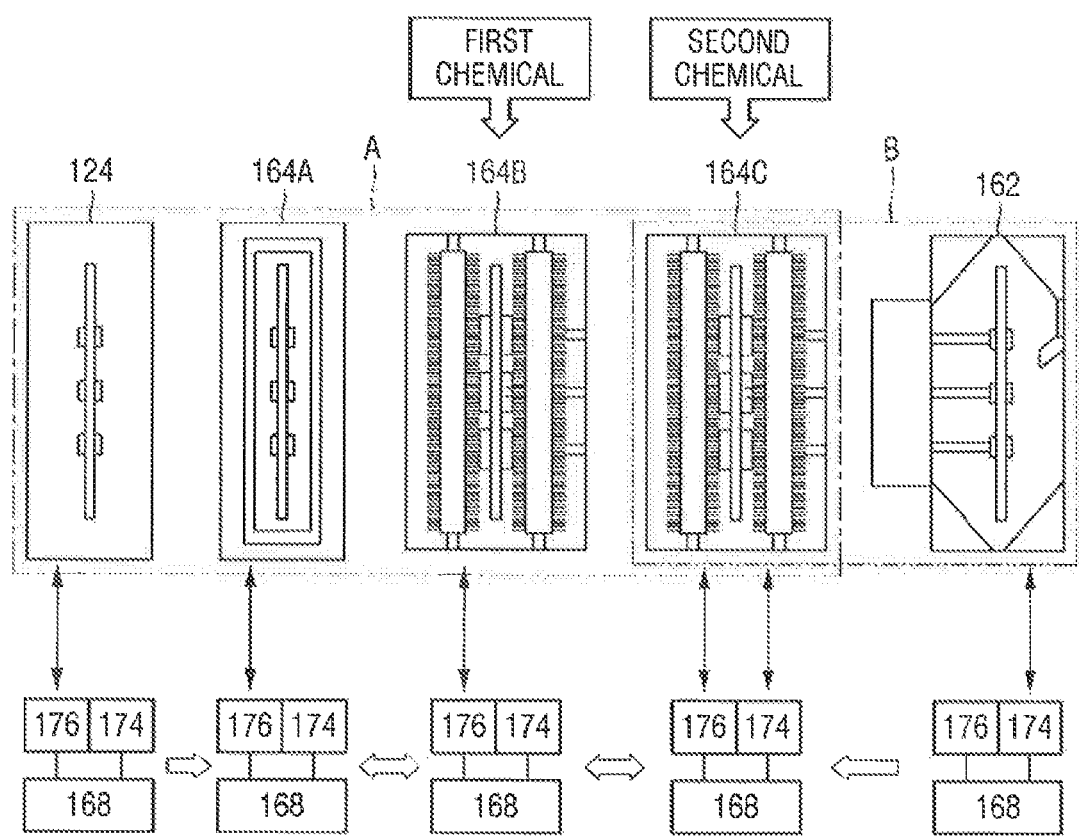
FIG. 6 is a diagram illustrating a method for driving the cleaning device according to an embodiment of the present disclosure.

FIG. 6 is a diagram illustrating a method for driving the cleaning device 116 according to an embodiment of the present disclosure, FIG. 6 shows an example of how the areas managed by each of the blades may depend on which chemicals are used in the cleaning modules 160. For example, FIG. 6 shows that when the first brush module 164B and the second brush module 164C use different chemicals, the second brush module 164C may be the location where the cleaning device 116 switches from the first blade 176 to the second blade 174.

Referring to FIG. 6, in relation to the method for driving the cleaning device 116 according to an embodiment of the present disclosure, the area setting module 113 of FIG. 3 may first detect whether the chemicals used in the first brush module 164B and the second brush module 164C are the same as or different from each other. Further, the area setting module 113 may set the first blade 176 and the second blade 174 so that the operation areas of the first blade 176 and the second blade 174 change depending on whether the chemicals are the same or different.

For example, when the chemicals used in the first brush module 164B and the second brush module 164C are a first chemical and a second chemical different from each other, the area setting module 113 may set the first area A to include the input module 124, the megasonic module 164A, the first brush module 164B and the second brush module 164C, and may set the second area B to include the second brush module 164C and the drying module 162.

For example, in a case where a film of the wafer 122 to be polished is a film of oxide series (e.g., PETEOS (Plasma Enhanced Tetraethylorthosilicate) film) or in some cases where the film of the wafer 122 to be polished is a tungsten (W) film among the metal series, the first brush module 1648 may use hydrofluoric acid (HF) as cleaning chemical, and the second brush module 164C may use ammonia ($NH_4OH$) as cleaning chemical. In this case, by considering that a difference in the contamination degree between the first brush module 164B and the second brush module 164C is relatively large, the first area A may be set to include the input module 124, the megasonic module 164A, the first brush module 164B and the second brush module 164C, and the second area B may be set to include the second brush module 164C and the drying module 162.

Figure 7:
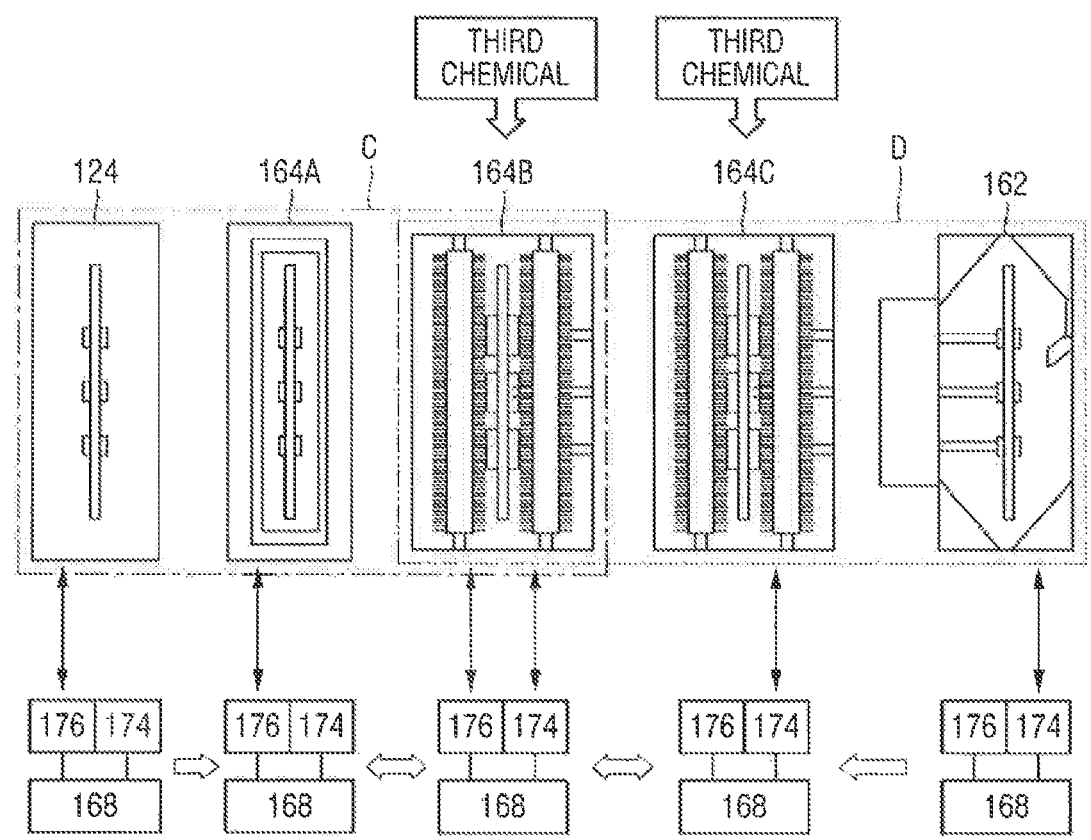
FIG. 7 is a diagram illustrating a method for driving the cleaning device according to an embodiment of the present disclosure.

Next, FIG. 7 is a diagram illustrating a method for driving the cleaning device 116 according to an embodiment of the present disclosure. Like FIG. 6, FIG. 7 shows an example of how the areas managed by each of the blades may depend on which chemicals are used in the cleaning modules 160. However, FIG. 6 shows that when the first brush module 164B and the second brush module 164C use the same chemicals, the first brush module 164B may be the location where the cleaning device 116 switches from the first blade 176 to the second blade 174.

Referring to FIG. 7, when the chemicals used in the first brush module 164B and the second brush module 164C are the same third chemical, the area setting module 113 may set the first area C to include the input module 124, the megasonic module 164A and the first brush module 164B, and may set the second area D to include the first brush module 1648, the second brush module 164C and the drying module 162.

For example, in a case where the film of the wafer 122 to be polished is a copper (Cu) film among metal series film or in some other cases where the film of the wafer 122 to be polished is tungsten (W) or copper (Cu) film among metal series, the first brush module 164B and the second brush module 164C may use the same exclusive cleaning agent as cleaning chemicals. In this case, as the cleaning is sufficiently performed even by going through the first brush module 164B, by considering that the difference in contamination degree between the first brush module 164B and the second brush module 164C is relatively small, the first area C may be set to include the input module 124, the megasonic module 164A and the first brush module 164B, and the second area D may be set to include the first brush module 164B, the second brush module 164C and the drying module 162.

In this way, by setting the operating areas of the first blade 176 and the second blade 174 to be changed depending on whether the cleaning chemicals used in the first brush module 164B and the second brush module 164C are the same or different from each other, it is possible to further reduce the contamination degree of the cleaning device 116 and the extent to which contaminants are transferred from the cleaning device 116.

Figure 8:
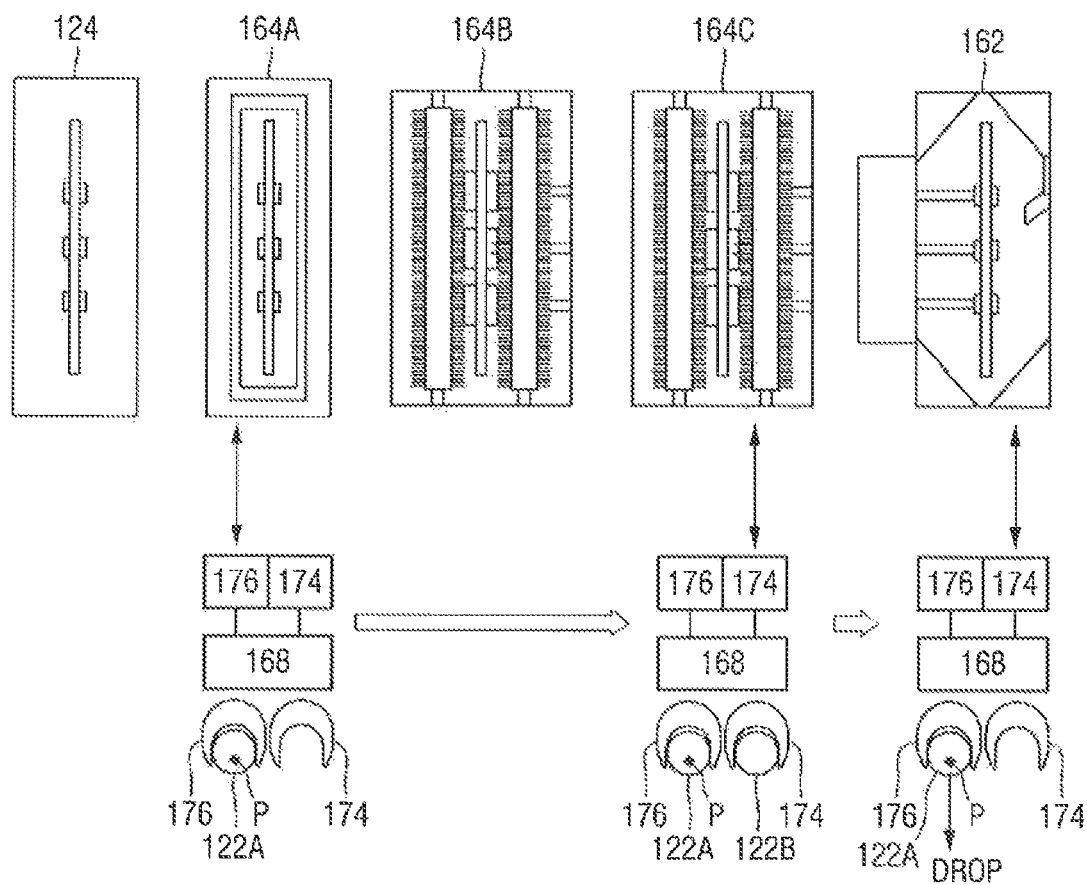
FIG. 8 is a diagram illustrating contamination that may occur with the operation of the cleaning device of FIG. 1.

FIG. 8 is a diagram illustrating contamination that may be generated with the operation of the cleaning device 116 of FIG. 1, FIG. 8 may illustrate various examples of how contamination may be spread among cleaning modules 160 based on moving multiple wafers 122 through the cleaning device 116 simultaneously. Accordingly, aspects of the present disclosure describe methods for preventing the spread of contamination between cleaning modules 160 as shown in FIG. 8.

Referring to FIG. 8, even when each of the first blade 176 or the second blade 174 of the cleaning device 116 of FIG. 1 operates in divided operating regions, for example, there may be a problem that contaminants generated in the megasonic module 164A are transferred to the drying module 162.

For example, the first blade 176 may pick up the wafer 122A polished through the input module 124 and may drop off the wafer 122A to the megasonic module 164A for cleaning the wafer 122A. Thereafter, the first blade 176 may pick up the wafer 122A inserted in the megasonic module 164A for cleaning of the next stage. However, before the first blade 176 drops off the wafer 122A to the first brush module 164B, the second blade 174 may pick up the wafer 122B inserted in the second brush module 164C. Further, the second blade 174 may drop off the wafer 122B to the drying module 162.

At this time, when the first blade 176 picks up the wafer 122A inserted in the megasonic module 164A, contaminated particles (or contaminated liquid) P generated at the stage of the megasonic module 164A may adhere to the wafer 122A, and the first blade 176 may still hold the wafer 122A with the contaminated particles (or contaminated liquid) P adhered to the bottom thereof, until the time point at which the second blade 174 drops off the wafer 122B to the drying module 162.

Two example cases will now be described where the contamination degree may increase. A first case is a case where, since the running beam 168 is located at a position corresponding to the second brush module 164C, immediately before the second blade 174 picks up the wafer 122B subjected to cleaning of the second brush module 164C, the contaminated liquid dropping from the wafer 122A in the first blade 176 may drop to the wafer 122B inside the second brush module 164C to directly contaminate the wafer 122B and creates a contamination map of a unique shape on the wafer 122B.

In a second case, in a process in which the second blade 174 picks up the wafer 122B from the second brush module 164C and then drops off the wafer 122B to the drying module 162 While the wafer 122A is hanging on the first blade 176, since the running beam 168 is at a position corresponding to the drying module 162, contaminated particles (or contaminated liquid) P dropping down from the wafer 122A may enter the drying module 162, and the contamination degree of the wafer 122B dried in the drying module 162 may also increase accordingly.

For example, even when the first blade 176 or the second blade 174 of the cleaning device 116 operates in the respective divided operation regions, for example, there may be a problem that contaminants generated in the megasonic module 164A are transferred to the drying module 162. Hereinafter, an embodiment of the present disclosure for solving such a problem will be described with reference to FIG. 9.

Figure 9:
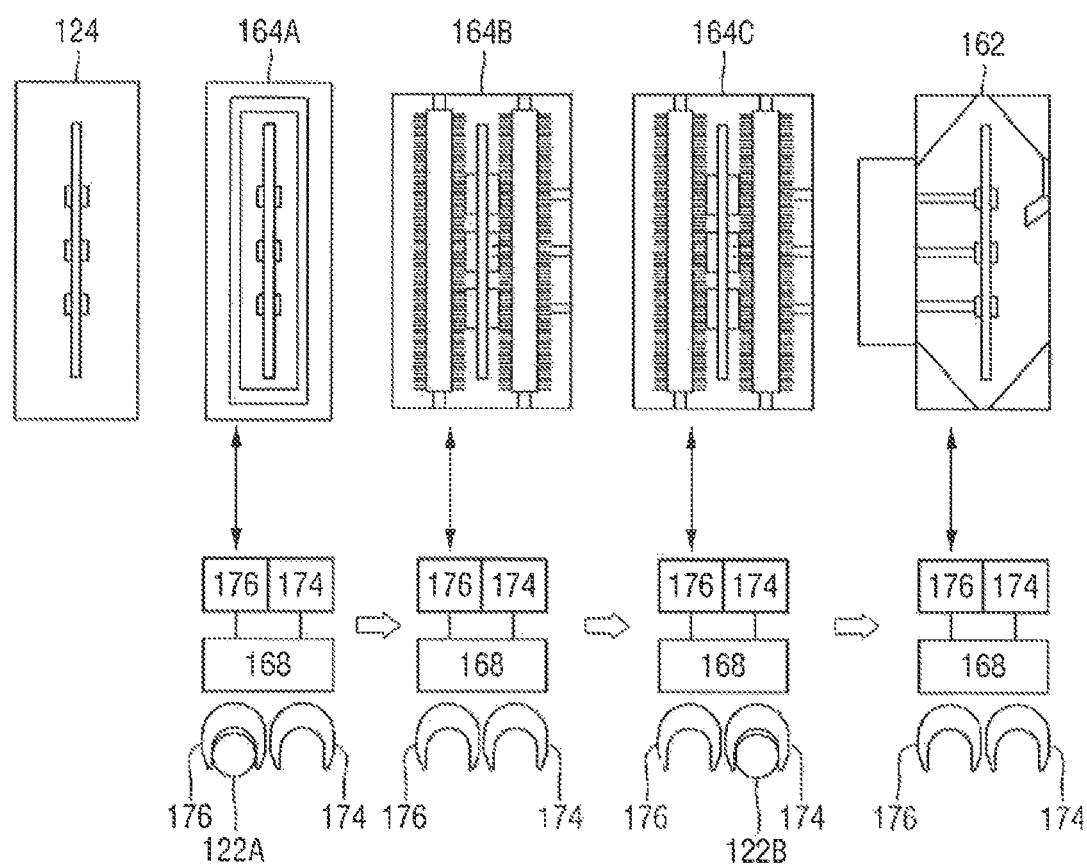
FIG. 9 is a diagram illustrating a method for driving the cleaning device according to an embodiment of the present disclosure.

FIG. 9 is a diagram illustrating a method for driving the cleaning device 116 according to an embodiment of the present disclosure. For example, FIG. 9 shows a method for preventing the type of contamination spread described above with reference to FIG. 8 (i.e., contamination based on moving more than one wafer 122 through the cleaning device 116 at the same time). For example, the order of removing and inserting one of the wafers 122 into the cleaning modules 160 may depend on the status of another of the wafers 122.

Referring to FIG. 9, the area setting module 113 may set the first area A to include the input module 124, the megasonic module 164A, the first brush module 164B and the second brush module 164C, and may set the second area B to include the second brush module 164C and the drying module 162 in accordance with the contents described above with reference to FIG. 5.

In this case, the second blade 174 executes the operation of removing the wafer 122 in the second direction (Z-axis direction) with respect to cleaning modules commonly included in the first area A and the second area B, only when the first blade 176 is empty, that is, only when the wafer 122A is not held.

In other words, the operation of picking up the wafer 122B from the second brush module 164C by the second blade 174 is not allowed before the first blade 176 picks up the wafer 122A from the megasonic module 164, and drops off the wafer 122A to the first brush module 164B. According to this embodiment, the first blade 176 picking up the wafer 122A from the megasonic module 164A first drops off the wafer 122A to the first brush module 164B, and thereafter, the second blade 174 picks up the wafer 122B inserted in the second brush module 164C.

In this way, by ensuring that the first blade 176 and the second blade 174 do not simultaneously pick up the wafers 122A and 122B, it is possible to further reduce contamination degree of the cleaning device 116 and the extent to which contaminations are transferred from the cleaning device 116.

For example, the cleaning device 116 may be configured to avoid moving the running beam 168 (along with the first blade 176 and the second blade 174) into the area of a cleaning module 160 if one of the blades is holding a wafer 122 that hasn't been processed by the prior cleaning module. For example, the running beam 168 may be prevented from moving near the drying module if the first blade 176 carries a wafer 122 that has just been cleaned by the first brush module 164B.

Figure 10:
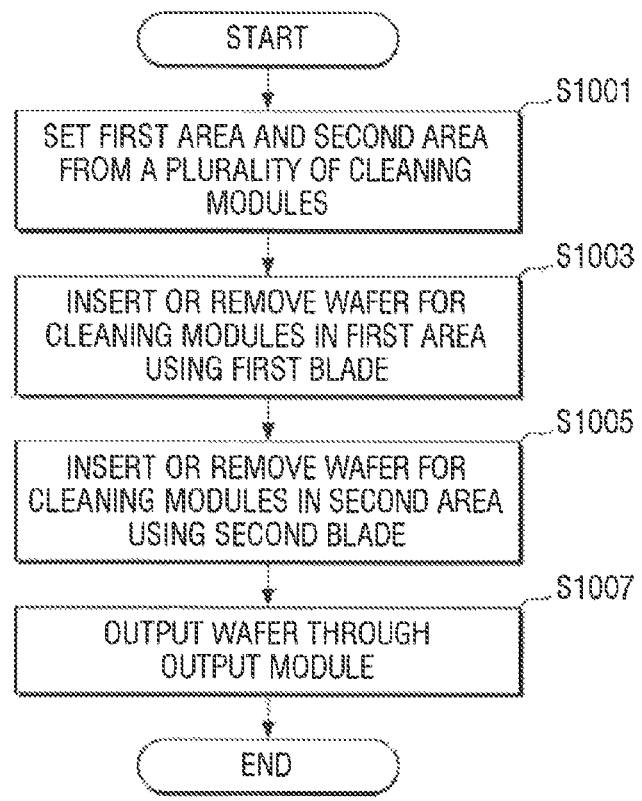
FIG. 10 is a flowchart illustrating a method for driving the cleaning device according to an embodiment of the present disclosure.

FIG. 10 is a flowchart illustrating a method for driving the cleaning device 116 according to an embodiment of the present disclosure.

Referring to FIG. 10, a method for driving the cleaning device 116 according to an embodiment of the present disclosure includes setting (S1001) some of a plurality of cleaning modules 160 as the first area A and some of the plurality of cleaning modules 160 as the second area B.

Further, the method includes performing (S1003) an operation of inserting or removing the wafer 122 in the second direction (Z-axis direction) in the first area A including some of the cleaning modules of the plurality of cleaning modules 160, using the first blade 176.

In addition, the method may include performing (S1005) an operation of inserting or removing the wafer 122 in the second direction (Z-axis direction) in the second area B including another set of cleaning modules of the plurality of cleaning modules 160, using the second blade 174. In some examples, the first area A may overlap with the second area B (i.e., one or more of the cleaning modules 160 may be located in both areas).

Further, the method includes outputting (S1007) the wafer 122 which has been completely cleaned and dried through the output module 156.

Each step of the method may be modified to include the various details of the disclosure described above with reference to FIGS. 1 to 9.

According to various embodiments of the present disclosure described above, by dividing the areas of the plurality of cleaning modules 160 to distinguish the operating areas of the first blade 176 and the second blade 174, it is possible to prevent or reduce transfer of contaminants from one module to another module, such as transfer of contaminants generated in the megasonic module 164A not only to the first brush module 164B but also to the first brush module 164C and further to the drying module 162.

Also, by setting the operation areas of the first blade 176 and the second blade 174 (i.e., first area A and second area B) to be changed depending on whether the cleaning chemicals used in the first brush module 164B and the second brush module 164C are the same as or different from each other, it is possible to further reduce the contamination degree of the cleaning device 116 and the extent to which contaminants are transferred from the cleaning device 116.

Furthermore, by controlling the first blade 176 and the second blade 174 to not pick up the wafers 122A and 122B at the same time, it is possible to further reduce contamination degree of the cleaning device 116 and the extent to which contaminants are transferred from the cleaning device 116.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A method for driving a cleaning device which cleans a wafer after chemical mechanical polishing (CMP), the cleaning device including a plurality of cleaning modules and a running beam configured to convey the wafer in a first direction between the plurality of cleaning modules, the running beam including a first blade and a second blade configured to insert or remove the wafer with respect to one of the plurality of cleaning modules in a second direction perpendicular to the first direction, the first blade and the second blade being fixed to the running beam to be movable in the second direction, and the plurality of cleaning modules including an input module, a megasonic module, a first brush module, a second brush module and a drying module, the driving method comprising:

performing an operation of inserting or removing the wafer in the second direction using the first blade, in a first area including some cleaning modules of the plurality of cleaning modules;

performing an operation of inserting or removing the wafer in the second direction using the second blade, in a second area including some other cleaning modules of the plurality of cleaning modules;

detecting whether chemicals used in the first brush module and the second brush module are the same as or different from each other; and setting the first area to include the input module, the megasonic module, the first brush module and the second brush module, and setting the second area to include the second brush module and the drying module, when the chemicals used in the first brush module and the second brush module are different from each other.

2. The method for driving the cleaning device of claim 1, wherein performing the operation of inserting or removing the wafer in the second direction using the first blade comprises:

performing only an operation of inserting the wafer in the second direction, with respect to a cleaning module commonly included in the first area and the second area among the plurality of cleaning modules, using the first blade.

3. The method for driving the cleaning device of claim 2, wherein performing the operation of inserting or removing the wafer in the second direction using the second blade comprises:

performing only an operation of removing the wafer in the second direction with respect to the cleaning module commonly included in the first area and the second area among the plurality of cleaning modules, using the second blade.

4. The method for driving the cleaning device of claim 3, wherein performing only the operation of removing the wafer in the second direction with respect to the cleaning module commonly included in the first area and the second area, using the second blade comprises:

performing the operation of removing the wafer in the second direction using the second blade, with respect to the cleaning module commonly included in the first area and the second area, only when the first blade is empty.

5. The method for driving the cleaning device of claim 1, wherein performing the operation of inserting or removing the wafer in the second direction using the first blade comprises:

refraining from performing the operation of inserting or removing the wafer in the second direction with respect to a cleaning module not included in the first area and included only in the second area among the plurality of cleaning modules, using the first blade.

6. The method for driving the cleaning device of claim 5, wherein performing the operation of inserting or removing the wafer in the second direction using the second blade comprises:

refraining from performing the operation of inserting or removing the wafer in the second direction with respect to a cleaning module not included in the second area and included only in the first area among the plurality of cleaning modules, using the second blade.

7. The method for driving the cleaning device of claim 1, further comprising:

setting the first area to include the input module, the megasonic module and the first brush module, and setting the second area to include the first brush module, the second brush module and the drying module, when the chemicals used in the first brush module and the second brush module are the same as each other.

8. A computer-readable recording medium in which a driving program of a cleaning device for cleaning a wafer after chemical mechanical polishing (CMP) is stored, wherein the cleaning device includes a plurality of cleaning modules and a running beam configured to convey the wafer in a first direction between the plurality of cleaning modules, the running beam includes a first blade and a second blade configured to insert or remove the wafer with respect to one of the plurality of cleaning modules in a second direction perpendicular to the first direction, the first blade and the second blade are fixed to the running beam to be movable in the second direction, and the plurality of cleaning modules includes an input module, a megasonic module, a first brush module, a second brush module and a drying module, the driving program comprising instructions for:

performing an operation of inserting or removing the wafer in the second direction using the first blade, in a first area including some cleaning modules of the plurality of cleaning modules;

performing an operation of inserting or removing the wafer in the second direction using the second blade, in a second area including some other cleaning modules of the plurality of cleaning modules;

wherein the driving program detects whether chemicals used in the first brush module and the second brush module are the same as or different from each other, and when the chemicals used in the first brush module and the second brush module are different from each other, the driving program sets the first area to include the input module, the megasonic module, the first brush module and the second brush module, and sets the second area to include the second brush module and the drying module.

9. The computer-readable recording medium of claim 8, wherein performing the operation of inserting or removing the wafer in the second direction using the first blade comprises:

performing only an operation of inserting the wafer in the second direction with respect to a cleaning module commonly included in the first area and the second area among the plurality of cleaning modules, using the first blade.

10. The computer-readable recording medium of claim 8, wherein performing the operation of inserting or removing the wafer in the second direction using the first blade comprises:

refraining from performing the operation of inserting or removing the wafer in the second direction with respect to a cleaning module not included in the first area but included only in the second area among the plurality of cleaning modules, using the first blade.

\* \* \* \* \*